United States Patent
Kazumori

(10) Patent No.: US 6,653,632 B2
(45) Date of Patent: Nov. 25, 2003

(54) SCANNING-TYPE INSTRUMENT UTILIZING CHARGED-PARTICLE BEAM AND METHOD OF CONTROLLING SAME

(75) Inventor: Hiroyoshi Kazumori, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 10/295,000

(22) Filed: Nov. 14, 2002

(65) Prior Publication Data

US 2003/0116709 A1 Jun. 26, 2003

(51) Int. Cl.[7] .............................. H01J 3/36; H01J 3/12
(52) U.S. Cl. .................. 250/310; 250/307; 250/396 R; 250/311
(58) Field of Search ................................ 250/305, 306, 250/310, 311, 397, 398, 396 ML, 396 R, 441.11, 442.11

(56) References Cited

U.S. PATENT DOCUMENTS

| | | | |
|---|---|---|---|
| 6,107,637 A | * 8/2000 | Watanabe et al. | 250/559.3 |
| 6,232,601 B1 | * 5/2001 | Schmitt et al. | 250/310 |
| 6,333,510 B1 | * 12/2001 | Watanabe et al. | 250/559.27 |
| 6,573,508 B1 | * 6/2003 | Ito | 250/396 R |
| 2003/0098415 A1 | * 5/2003 | Matsuya et al. | 250/306 |

FOREIGN PATENT DOCUMENTS

| | | | |
|---|---|---|---|
| JP | 10334844 | 12/1998 | |
| JP | 10-334844 | * 12/1998 | H01J/37/147 |
| JP | 02-002245960 | * 8/2002 | H01J/37/28 |

* cited by examiner

Primary Examiner—John R. Lee
Assistant Examiner—James P. Hughes
(74) Attorney, Agent, or Firm—Webb Ziesenheim Logsdon Orkin & Hanson, P.C.

(57) ABSTRACT

A scanning-type instrument is realized which utilizes a charged-particle beam and automates adjustments, if a voltage is applied to the specimen, to thereby provide excellent operational controllability. When a voltage is applied to the specimen, the electron beam would normally defocus. A signal corresponding to the voltage applied to the specimen is supplied to a CPU. An objective lens current is supplied to the coil on the objective lens from a power supply under control of the CPU to refocus the beam. As a result, the beam hitting the specimen is prevented from defocusing if a voltage is applied to the specimen. When the strength of the objective lens is varied, scanning signals to the deflection coils are adjusted in response to the variation. Variation in the magnification of the image and rotation of the image are corrected.

13 Claims, 2 Drawing Sheets

SCANNING-TYPE INSTRUMENT UTILIZING CHARGED-PARTICLE BEAM AND METHOD OF CONTROLLING SAME

BACKGROUND OF THE INVENTION

1. Field of the Invention

The present invention relates to a scanning-type instrument which utilizes a charged particle beam and images a specimen by focusing the beam onto the specimen with an objective lens, scanning the beam across the specimen, detecting a signal arising from the specimen, such as secondary electrons, and displaying an image of the specimen based on the detected signal. The invention also relates to a method of controlling this instrument.

2. Description of Related Art

A scanning electron microscope, that is, a kind of scanning-type instrument utilizing a charged-particle beam, is designed to sharply focus a primary electron beam onto a specimen and to scan the beam within a given range on the specimen. The electron beam is directed at the specimen, resulting in secondary electrons. These secondary electrons are then detected. The resulting signal is sent to a CRT synchronized with scanning of the primary electron beam. In this way, a scanning image of the specimen is displayed.

The fundamental structure of such a scanning electron microscope is shown in FIG. 3. This microscope has an objective lens 101, an electron gun 102 for producing a primary electron beam EB and accelerating it, condenser lenses 103, and other components are mounted above the objective lens 101. The primary electron beam EB is sharply focused by the condenser lenses 103 and objective lens 101 and directed at a specimen 104. Scan coils 105 are disposed above the objective lens 101 to scan the primary electron beam EB in two dimensions across the specimen 104.

As the electron beam EB is directed at the specimen 104, secondary electrons are produced. These secondary electrons are collected by a mesh collector (not shown) to which a voltage of about 100 V is applied. The collected secondary electrons are guided to a secondary electron detector 106, which is composed of a corona ring 107, a scintillator 108, and a photomultiplier tube 109. A high voltage of the order of 10 kV is applied to the corona ring 107 from a corona ring voltage source (not shown). The secondary electrons are accelerated and made to strike the scintillator 108. The photomultiplier tube 109 converts the light from the scintillator 108 into an electrical signal.

The secondary electron signal detected by the secondary electron detector 106 is supplied as a brightness-modulating signal via an amplifier and known signal-processing circuitry (none of which are shown) for adjusting the brightness and contrast to a CRT (not shown) synchronized with the scanning of the primary electron beam. As a result, a scanning secondary electron image of a certain two-dimensional area on the specimen is displayed on the viewing screen of the CRT.

In this scanning electron microscope, the geometry of the objective lens 101 is an important factor in determining the instrumental resolution. Therefore, in order to improve the resolution, the aberration coefficient of the objective lens 101 must be reduced. Accordingly, the aberration coefficient is suppressed to within 3 mm by adopting an "in-lens" objective lens in which the magnetic field on the specimen is intensified. Alternatively, a "semi-in-lens" objective lens (strong magnetic-field objective lens) may be adopted.

With the in-lens objective lens, the specimen is placed within the magnetic field set up by the objective lens. With the semi-in-lens objective lens, a single magnetic lens field is produced below the bottom surfaces of the inner and outer polepieces. The specimen is placed within this magnetic lens field.

To reduce the effects of objective lens aberration, it is customary to decelerate the electron beam immediately before the specimen. For this purpose, the primary electron beam having increased energies is passed through the objective lens. This method is known as a retarding field method. The resolution can be enhanced further at low accelerating voltages. In one retarding field method, a negative voltage is applied to the specimen as disclosed, for example, in Japanese Patent Laid-Open No. 10-334844/1998.

Where a retarding field method is adopted in which a negative voltage is applied to a specimen, a voltage is applied to the specimen in the SEM imaging mode. In this case, the focus of the objective lens varies. Accordingly, in the case of a magnetic objective lens, it is necessary to vary the conditions under which the objective lens is focused by varying the objective lens current.

If the conditions under which the objective lens is focused are varied, some parameters (e.g., magnification, image rotational angle, and angular aperture control lens current) vary concomitantly. In the existing scanning electron microscope, if a voltage is applied to the specimen, these parameters and conditions are maintained. Therefore, at this time, other parameters and conditions varying concomitantly with the application of the voltage to the specimen need to be adjusted manually. The required operations are quite cumbersome to perform.

SUMMARY OF THE INVENTION

It is an object of the present invention to provide a scanning-type instrument which utilizes a charged-particle beam and automates adjustments, even if a voltage is applied to a specimen, to thereby provide excellent operational controllability. It is another object of the present invention to provide a method of controlling this instrument.

A scanning-type instrument which utilizes a charged-particle beam and built in accordance with the present invention comprises: an objective lens for focusing the charged-particle beam onto a specimen; deflection means for scanning the beam within a desired area on the specimen; and detection means for detecting a signal produced as the specimen is irradiated with the charged-particle beam. The instrument obtains an image of the specimen based on the signal detected by the detection means. The instrument is characterized in that it further includes a voltage application circuit for applying a voltage to the specimen and first control circuit for controlling the strength of the objective lens according to the voltage applied to the specimen. Defocus of the beam caused by the application of the voltage to the specimen is corrected under control of the first control circuit.

In a method of controlling a scanning-type instrument utilizing a charged-particle beam in accordance with the present invention, the scanning-type instrument has an objective lens for focusing the charged-particle beam onto a specimen; deflection means for scanning the beam within a desired area on the specimen; and detection means for detecting a signal produced as the specimen is irradiated with the charged-particle beam. The instrument obtains an image of the specimen based on the signal detected by the detection means. The method consists of applying a voltage to the specimen and controlling the strength of the objective lens according to the voltage applied to the specimen to thereby correct defocus of the beam caused by the application of the voltage to the specimen.

Other objects and features of the invention will appear in the course of the description thereof, which follows.

DESCRIPTION OF THE PREFERRED EMBODIMENTS

Figure 1:
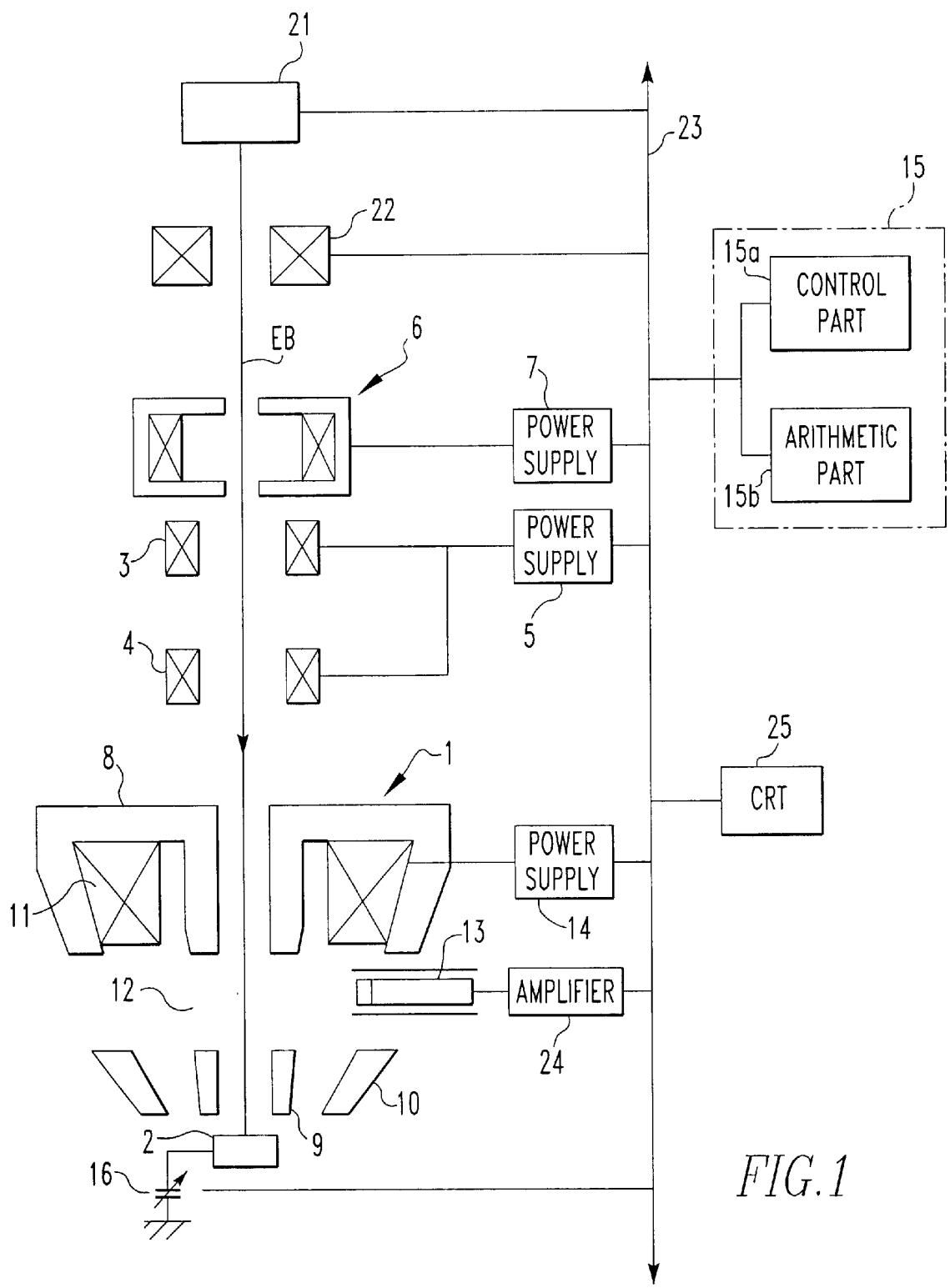
FIG. 1 is a diagram schematically illustrating a scanning electron microscope according to the present invention.

Referring to FIG. 1, there is shown a scanning electron microscope according to the present invention. This instrument has an electron gun 21 producing an electron beam EB sharply focused onto a specimen 2 by condenser lenses 22 and an objective lens 1. The beam EB is deflected by deflection coils 3 and 4 to scan the position on the specimen 2 hit by the beam EB. Two-dimensional scanning signals are supplied to the deflection coils 3 and 4 from a scanning signal-generating power supply 5. An angular aperture control lens 6 is located above the deflection coils 3 and 4. An aperture control lens current is supplied to the angular aperture control lens 6 from a lens current power supply 7.

The objective lens 1 is composed of a yoke 8, an inner polepiece 9, an outer polepiece 10, and a coil 11. Apertures 12 are formed in the inner polepiece 9 near its bottom end surface. The number of the apertures 12 is two or four to make the structure of the objective lens 1 axisymmetric. A secondary electron detector 13 is mounted outside an aperture 12 in the inner polepiece 9 and is located opposite to the outer polepiece 10. An objective lens current is supplied to the coil 11 on the objective lens 1 by an objective lens current power supply 14. The scanning signal-generating power supply 5, power supply 7 for the angular aperture control lens 6, and current power supply 14 for the objective lens 1 are controlled by a CPU 15 through a schematically illustrated bus line 23.

Figure 3:
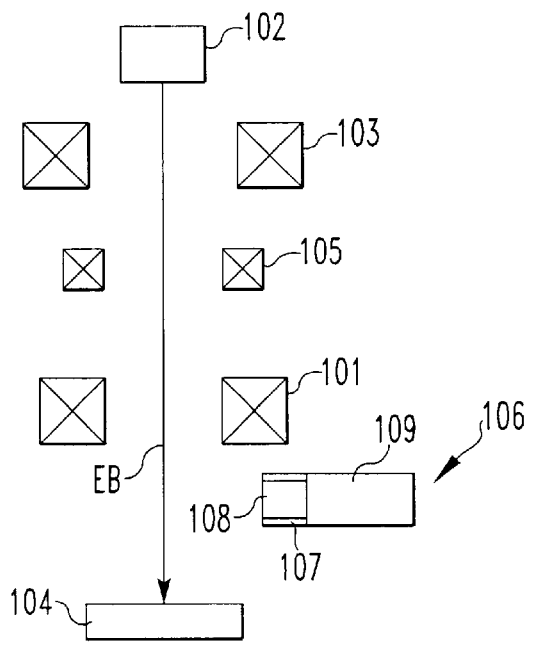
FIG. 3 is a diagram of a conventional scanning electron microscope.

The secondary electron detector 13 is similar in structure with the secondary electron detector 106 already described in connection with FIG. 3 and consists of a combination of a scintillator and a photomultiplier tube. An annular electrode (corona ring) is mounted around the circular scintillator. A positive voltage is applied to the electrode to attract secondary electrons. The voltage is set to a value of about 10 kV. The output signal from the secondary electron detector 13 is amplified by an amplifier 24 and then fed to a CRT 25 synchronized with the scanning of the electron beam EB.

A variable voltage source 16 is connected with the specimen 2 to permit one to apply any desired voltage to the specimen 2. The operation of the instrument constructed in this way is as follows.

When a scanning secondary electron image is observed, given scanning signals are supplied from the scanning signal-generating power supply 5 to the deflection coils 3 and 4. A desired two-dimensional region on the specimen 2 is raster-scanned by the electron beam EB.

The objective lens 1 is so designed that a single magnetic lens field is produced below the bottom surfaces of the inner polepiece 9 and outer polepiece 10. The specimen 2 is positioned within this magnetic lens field. As the specimen 2 is irradiated with the electron beam EB, secondary electrons, and so on, are produced. Those of the secondary electrons which have lower energies (e.g., less than 3 eV) are confined by the magnetic lens field and directed upward helically.

The voltage applied to the front face of the detector 13 forms an electric field near the apertures 12 in the inner polepiece 9. This electric field directs the lower-energy electrons toward the detector 13. The electrons collide against the scintillator of the detector 13, thus producing scintillation that is detected by the photomultiplier. The output signal from this photomultiplier is supplied via the amplifier 24 to the CRT 25 synchronized with the scanning signals. As a result, a secondary electron image of a desired region on the specimen 2 is displayed on the CRT 25.

When no voltage is applied to the specimen 2, a given objective lens current is supplied from the power supply 14 to the objective lens 1 so that the electron beam EB is focused onto the surface of the specimen 2 according to the energy of the electron beam EB (i.e., the accelerating voltage).

A signal for scanning the electron beam EB is supplied from the power supply 5 to the deflection coils 3 and 4 to achieve the set magnification. This magnification is determined by the magnitude of the amplitude of the scanning signals. To maintain the magnification constant even if the energy of the electron beam EB varies, it is necessary to adjust the amplitude of the scanning signals according to the accelerating voltage on the electron beam EB. An aperture lens current is supplied from the power supply 7 to the angular aperture control lens 6 to maintain the angular aperture of the electron beam EB hitting the specimen 2 in an optimum state according to the energy of the electron beam EB.

Under this condition, if a voltage is applied to the specimen 2 from the voltage source 16, the electron beam EB is decelerated immediately ahead of the specimen 2. If it is assumed that the accelerating voltage on the electron beam EB is 5 kV and that a voltage of 4 kV is applied to the specimen 2 from the voltage source 16, the accelerating voltage varies to 1 kV immediately ahead of the specimen 2. In this way, the electron beam EB is focused by the objective lens 1 at a high accelerating voltage and so the aberration can be reduced. On the other hand, the electron beam EB now less accelerated is made to hit the specimen 2. Where the specimen 2 is a semiconductor or insulator, charging of the surface of the specimen 2 can be prevented or greatly suppressed. Of course, the energy of the electron beam EB directed at the specimen 2 is reduced. Consequently, the specimen 2 is much less damaged by the irradiation.

When a voltage is applied to the specimen 2, the electron beam EB is defocused compared with the case where the voltage is not yet applied. Therefore, as a voltage is applied to the specimen 2, the power supply 14 needs to be adjusted to focus the beam. This focusing operation has been heretofore performed by adjusting the power supply 14 manually. In the present invention, a signal corresponding to the voltage applied to the specimen 2 is supplied to the arithmetic part 15b of the CPU 15 (see FIG. 2). An objective lens current is automatically supplied to the coil 11 on the objective lens 1 from the power supply 14 to refocus the electron beam EB by a first controller comprising the control part 15a of the CPU 15 and associated circuitry.

This new objective lens current corresponding to the voltage applied to the specimen 2 is varied using the following function. Let f(a) be the objective lens current through the objective lens when a voltage of a V is applied to the specimen 2. The objective lens current f(a) supplied into the objective lens 1 is found in the following manner:

$$f(a) = f(0) \times N$$

$$N = \frac{E_0 - a}{E_0^{\frac{1}{\alpha}}}$$

where $E_0$ is the energy of the primary electron beam EB and $\alpha$ is a coefficient.

When the voltage applied to the specimen 2 is varied, the arithmetic part 15b of the CPU 15 finds the new lens current using the equations above, and the control part 15a controls the power supply 14 according to the found current. In this way, the voltage applied to the objective lens is set to the found value. If a voltage is applied to the specimen 2, the electron beam EB directed at the specimen 2 does not defocus.

Figure 2:
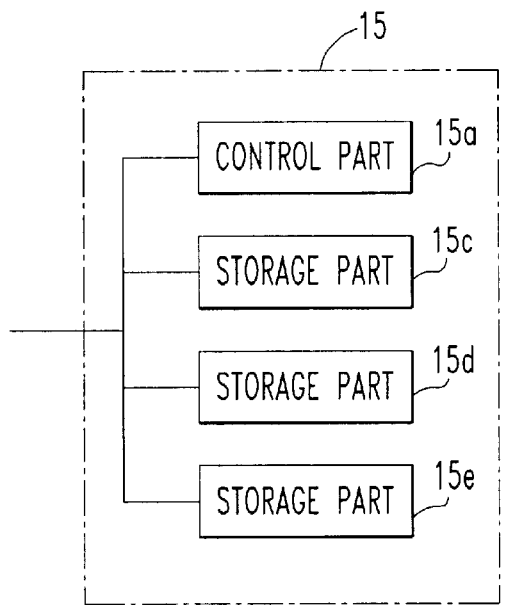
FIG. 2 is a diagram schematically illustrating a modified CPU used in the scanning electron microscope according to the present invention.

In the above-described automated control of the objective lens 1, a given calculation is performed to find a new objective lens current whenever the voltage applied to the specimen 2 is varied. Another method is also possible. As shown in FIG. 2, a storage part 15c for storing a look-up table of combinations of optimum objective lens current values, values of the accelerating voltage on the primary electron beam EB, and values of the voltage applied to the specimen 2 is prepared in the CPU 15. These values of the objective lens current are calculated using the above formulas. When a voltage is applied to the specimen 2, data about the optimum objective lens current is read from the look-up table stored in the storage part 15c. The control part 15c of the CPU 15 controls the power supply 14 based on the data.

Where a voltage is applied to the specimen 2, the lens current through the objective lens 1 is varied in this way. The primary electron beam EB is focused onto the surface of the specimen 2. However, varying the objective lens current changes the lens strength. This, in turn, varies the deflection angle of the primary electron beam EB. In consequence, the region scanned with the electron beam EB varies, thus changing the magnification.

Since the strength of the objective lens 1 varies, the primary electron beam EB within the magnetic field set up by the objective lens 1 rotates. This rotates the region scanned with the electron beam EB. Consequently, the obtained secondary electron image turns. Furthermore, the angular aperture of the electron beam EB hitting the specimen 2 varies in response to variations in the strength of the objective lens 1.

Therefore, in the present embodiment, when a voltage is applied to the specimen 2, the power supply 5 for supplying scanning signals to the deflection coils 3 and 4 is controlled. The amplitude of the scanning signals is adjusted to correct the variation in the magnification. When a voltage is applied to the specimen 2, the strength of the objective lens 1 varies, and the rotational angle of the primary electron beam EB within the magnetic field varies. The obtained image also rotates. The variation in the rotational angle is corrected by varying the direction of raster scan supplied from the power supply 5 to the deflection coils 3 and 4 by an amount corresponding to the variation in the rotational angle. Consequently, magnification variation and image rotation are prevented if the strength of the objective lens 1 is varied as a voltage is applied to the specimen 2 by a second controller comprised of CPU 15 and the associated circuitry.

Furthermore, when the strength of the objective lens 1 is varied, the angular aperture of the primary electron beam EB hitting the specimen 2 varies. The power supply 7 is controlled by the CPU 15 such that a lens current for correcting the variation in the angular aperture is supplied from the power supply 7 to the angular aperture control lens 6.

When the strength of the objective lens 1 varies, the scanning signals supplied to the deflection coils 3 and 4 are optimized and the strength of the angular aperture control lens 6 is varied under control of the CPU 15. In particular, the CPU 15 further includes a storage part 15d holding a look-up table of variations in the scanning signal supplied to the deflection coils 3 and 4 when the strength of the objective lens 1 is varied at various values of the accelerating voltage on the primary electron beam EB. When a voltage is applied to the specimen 2 and the strength of the objective lens 1 is varied concomitantly, the control part 15a of the CPU 15 reads data about variations in the scanning signals from the look-up table stored in the storage part 15d and controls the power supply 5 that produces the scanning signals.

The strength of the angular aperture control lens 6 is varied similarly. That is, a look-up table of variations in the lens current supplied to the angular aperture control lens 6 in response to variations in the strength of the objective lens 1 is stored in the storage part 15e of the CPU 15. When a voltage is applied to the specimen 2 and the strength of the objective lens 1 is varied concomitantly, a third controller comprising the control part 15a of the CPU 15 and associated circuitry reads data about the variations in the lens current through the angular aperture control lens 6 from the look-up table stored in the storage part 15e and controls the power supply 7 for the control lens 6.

In the above description, as a voltage is applied to the specimen 2 and the strength of the objective lens 1 is varied concomitantly, and the scanning signals supplied to the deflection coils 3 and 4 and the angular aperture control lens 6 are also controlled. Deflection systems used for astigmatic correction and axial alignment need to be adjusted when the strength of the objective lens 1 varies. These deflection systems can also be automatically optimized under control of the CPU 15.

While a preferred embodiment of the present invention has been described thus far, the invention is not limited thereto but rather various changes and modifications are possible. For example, a scanning electron microscope is taken as an example in the foregoing description. The invention can also be applied to an ion beam apparatus, such as a scanning ion microscope, where a specimen surface is scanned with an ion beam. In the above embodiment, a magnetic lens field is used as the objective lens 1. The invention is also applicable to the case where an electrostatic lens is used as the objective lens. In this case, as a voltage is applied to the specimen, the strength of the electric field produced by the electrostatic objective lens is varied. Where a lens in which a magnetic field and an electric field are superimposed is used as the objective lens, as a voltage is applied to the specimen, one or both of the magnetic and electric fields are varied in strength.

As described thus far, in the instrument and method utilizing and controlling a charged-particle beam in accordance with the present invention, as a voltage is applied to a specimen, the strength of the objective lens is varied to correct defocus of the charged-particle beam caused by the application of the voltage. Consequently, the operational controllability can be improved immensely.

Furthermore, the deflection means is controlled according to the voltage applied to the specimen, and variation in the magnification of the specimen image and rotation of the image due to the application of the voltage are corrected. Hence, the operational controllability can be enhanced further.

In addition, an angular aperture control lens is mounted to control the angular aperture of the primary charged-particle beam impinging on the specimen. This lens is controlled according to the voltage applied to the specimen. A variation in the angular aperture of the beam due to the voltage applied to the specimen is corrected. In consequence, the operational controllability can be improved further.

Having thus described the invention with the detail and particularity required by the Patent Laws, what is desired protected by Letters Patent is set forth in the following claims.

The invention claimed is:

1. A scanning-type instrument utilizing a charged-particle beam, comprising:
    an objective lens for focusing the charged-particle beam onto a specimen;
    a deflector for scanning the beam within a desired area on the specimen;
    a detector for detecting a signal produced as the specimen is irradiated with the charged-particle beam;
    a system for creating an image of the specimen based on the signal detected by said detector;
    a voltage application device for applying a voltage to the specimen; and
    a first controller for controlling the strength of the objective lens according to the voltage applied to the specimen such that defocus of the charged-particle beam caused by the application of the voltage to the specimen is corrected under control of said first controller.

2. The scanning-type instrument of claim 1, further including a second controller for controlling said deflector according to the voltage applied to the specimen to correct variation in the magnification of said specimen image and rotation of the image due to the application of the voltage to the specimen.

3. The scanning-type instrument of claim 2, further including a first memory for storing variations in scanning signals as a look-up table, said scanning signals being supplied to said deflector according to the voltage applied to the specimen, wherein data about variations in the scanning signals is read from said first memory.

4. The scanning-type instrument of any one of claims 1 to 3, further including an angular aperture control lens for controlling the angular aperture of said charged-particle beam and a third controller for controlling said angular aperture control lens according to the voltage applied to the specimen, wherein a variation in the angular aperture of said charged-particle beam due to the application of the voltage to the specimen is corrected.

5. The scanning-type instrument of claim 4, further including a second memory for storing variations in an angular aperture control lens current as a look-up table, said angular aperture control lens current being supplied to said angular aperture control lens according to the voltage applied to said specimen, wherein variations in the angular aperture control lens current are read from said second memory.

6. The scanning-type instrument of any one of claims 1 to 3, wherein said charged-particle beam is an electron beam.

7. The scanning-type instrument of claim 6, wherein said objective lens is a magnetic lens field, and wherein an objective lens current (f(a)) supplied to said objective lens is given by:

$$f(a) = f(0) \times N$$

$$N = \frac{E_0 - a}{E_0^{\frac{1}{\alpha}}}$$

where $E_0$ is the energy of the electron beam and $\alpha$ is a coefficient, and wherein said objective lens current is supplied to said objective lens by said first controller.

8. The scanning-type instrument of claim 7, further including a third memory for storing various values of the objective lens current as a look-up table, said various values being found according to voltages applied to said specimen, wherein data about the objective lens current is read from said third memory.

9. A method of controlling a scanning-type instrument utilizing a charged-particle beam having an objective lens for focusing the charged-particle beam onto a specimen, a deflector for scanning said charged-particle beam across a desired region on said specimen, and a detector for detecting a signal produced as said specimen is irradiated with said charged-particle beam, said scanning-type instrument being designed to obtain an image of the specimen according to the signal detected by said detector, said method comprising the steps of:
    applying a voltage to said sample; and
    controlling the strength of said objective lens according to the voltage applied to said sample to correct defocus of said charged-particle beam due to the application of the voltage to the specimen.

10. The method of claim 9, wherein said deflector is controlled according to the voltage applied to said specimen to thereby correct variation in magnification of the image of the specimen and rotation of the image due to the application of the voltage to the specimen.

11. The method of claim 9 or 10, wherein variation in angular aperture of said charged-particle beam due to the application of the voltage to the specimen is corrected.

12. The method of claim 9 or 10, wherein said charged-particle beam is an electron beam.

13. The method of claim 12, wherein:
    (A) said objective lens is a magnetic lens field;
    (B) an objective lens current (f(a)) supplied to said objective lens is found using:

$$f(a) = f(0) \times N$$

$$N = \frac{E_0 - a}{E_0^{\frac{1}{\alpha}}}$$

where $E_0$ is the energy of the electron beam and $\alpha$ is a coefficient; and
    (C) said objective lens current is supplied to said objective lens by said first controller.

* * * * *

UNITED STATES PATENT AND TRADEMARK OFFICE
CERTIFICATE OF CORRECTION

PATENT NO. : 6,653,632 B2  Page 1 of 1
DATED : November 25, 2003
INVENTOR(S) : Hiroyoshi Kazumori It is certified that error appears in the above-identified patent and that said Letters Patent is hereby corrected as shown below:

<u>Title page,</u>
Insert:
-- [30]   Foreign Application Priority Data

Nov. 15, 2001   (JP) ………………….. 2001-349715 --.

Signed and Sealed this

Fourth Day of May, 2004

JON W. DUDAS
*Acting Director of the United States Patent and Trademark Office*